United States Patent [19]

Peterson

[11] 4,056,734
[45] Nov. 1, 1977

[54] COMPENSATED BASE DRIVE CIRCUIT TO REGULATE SATURATED TRANSISTOR CURRENT GAIN

[75] Inventor: William Anders Peterson, Lake Parsippany, N.J.

[73] Assignee: Bell Telephone Laboratories, Incorporated, Murray Hill, N.J.

[21] Appl. No.: 702,038

[22] Filed: July 2, 1976

[51] Int. Cl.² .................................... H03K 17/60
[52] U.S. Cl. ................................. 307/254; 363/21
[58] Field of Search ............... 321/2, 47; 331/112; 307/253, 254, 300; 323/17

[56] References Cited

U.S. PATENT DOCUMENTS

| 3,536,988 | 10/1970 | Boynton | 323/17 |
|---|---|---|---|
| 3,612,909 | 10/1971 | Imabayashi | 331/112 |
| 3,735,235 | 5/1973 | Hamilton et al. | 321/2 |
| 3,786,279 | 1/1974 | Wilson | 307/254 |
| 3,872,391 | 3/1975 | Dalley | 330/14 |
| 3,925,717 | 12/1975 | Kinnard | 321/2 |
| 4,005,351 | 1/1977 | Blum | 321/2 |

OTHER PUBLICATIONS

Analog Integrated Circuit Design, Van Nostrand Reinhold Co.; Microelectronic Series, 1972, Ch. 4, pp. 112-119.

Primary Examiner—William H. Beha, Jr.
Attorney, Agent, or Firm—Alfred G. Steinmetz

[57] ABSTRACT

A single-ended self-oscillating DC-to-DC converter is disclosed including base drive compensation circuitry. Compensation circuitry is active during saturation intervals of the power transistor to control its forced current gain at some fixed value irrespective of the magnitude of a saturated current flowing through the transistor.

4 Claims, 1 Drawing Figure

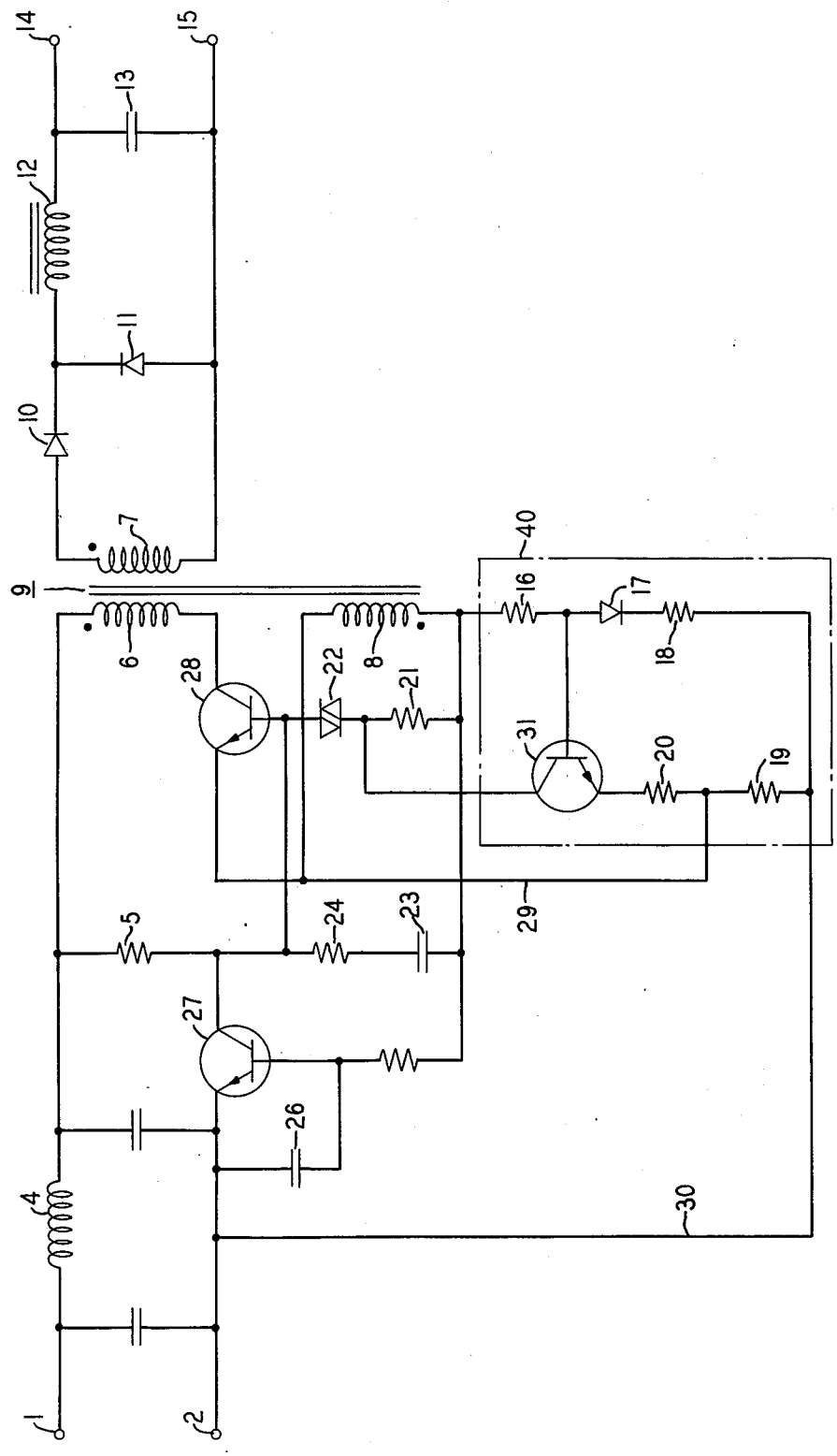

COMPENSATED BASE DRIVE CIRCUIT TO REGULATE SATURATED TRANSISTOR CURRENT GAIN

BACKGROUND OF THE INVENTION

1. Field of the Invention

This invention is concerned with the biasing of power transistors and is more specifically concerned with controlling the current gain of a saturated power transistor.

2. Prior Art

The power transistor in a converter circuit is normally periodically switched from its off condition into a saturated mode of operation. The magnitude of current flow through the saturated transistor is largely determined by the demands of the load connected to or coupled to the power transistor. This gives rise to a specific problem in controlling the base drive current to the saturated power transistor. In its saturated condition the collector current, which is responsive to the demands of the load, may vary but the base drive current normally remains constant. Hence, if the collector current becomes low, excessive stored charge will accumulate in the saturated transistor making the subsequent switching transition interval from conduction to nonconduction increase in time. On the other hand, the collector current may increase to a magnitude so high than the transistor may drop out of its saturated condition.

The prior art has attempted to solve this problem by use of transformer feedback. A particular example of this solution is disclosed in U.S. Pat. No. 3,735,235, issued to B. H. Hamilton et al on May 22, 1973. This patent discloses a rectifier circuit utilizing synchronous rectifying transistors. The transistors are periodically driven into saturation to rectify the applied input AC signals. To provide the proper base drive current when the transistor is saturated, a regenerative feedback base drive arrangement is utilized to drive the transistors into saturation. The regenerative feedback base drive arrangement comprises a feedback transformer which has individual transformer windings coupled to the base and collector of the rectifying transistors so as to produce a controlled base drive current that is proportional to the collector current. This proportionality is achieved through the regenerative action of the transformer which transforms the collector current of the rectifying transistor into the base drive current. While this arrangement satisfactorily maintains the rectifying power transistors in their saturated state, transformer-type feedbacks tend to be expensive and space consuming. In addition, due to the operative nature of the transformer, the power transistor being controlled tends to be latched either into a conducting or a nonconducting condition.

SUMMARY OF THE INVENTION

It is therefore an object of the invention to control the current gain of a saturated power transistor with a simple and efficient base drive compensating circuit to make the base drive current proportional to the collector current of a saturated transistor.

It is another object of the invention to control the current gain in a transistor without the use of magnetic components.

It is yet another object of the invention to compensate the base drive current to counteract variations in the base drive voltage supply.

A base drive compensating circuit embodiment in accord with the principles of the invention is disclosed which uses a controllable current sink to control the current gain of a saturated power transistor. The current magnitude drawn by the sink is responsive to the actual collector current output of the saturated power transistor. The current gain of the saturated power transistor is maintained at a constant by diverting base drive current from the saturated transistor as needed to stabilize the current gain in accord with the actual collector current. The base drive compensating circuitry includes a resistor bias current sink which is coupled to divert base drive current from the base of the power transistor. The voltage source which supplies the bias voltage to the power transistor is connected to a reference current branch of the current sink. A current drain branch of the current sink is connected to the base electrode of the power transistor. A portion of the resistance in the current drain branch is connected in series with the main conduction path of the saturated power transistor. The voltage drop across this portion of the resistance controls the current in the current drain branch to vary inversely with the current in the main conduction path of the saturated power transistor. Since this current is drawn from the base electrode, the base current will be proportional to the collector current of the saturated power transistor.

BRIEF DESCRIPTION OF THE DRAWING

The sole FIGURE discloses a single-ended converter whose power transistor is controlled by a biasing circuit which includes base drive compensation to stabilize the saturated current gain of the transistor according to the principles of the invention.

DETAILED DESCRIPTION

A single-ended converter including base drive compensation to control the saturated current gain of the power transistor is disclosed in the sole FIGURE. The DC voltage source, not shown, is coupled to the input terminals 1 and 2. Terminals 1 and 2 are periodically electrically connected in series circuit with the primary winding 6 of the power transformer 9 in response to the periodic switching of the switching transistor 28. The secondary winding 7 is coupled by a rectifying diode 10 and an output filter comprising the inductor 12 and capacitor 13 to the output terminals 14 and 15 to which a load may be connected. A commutating or flyback diode 11 is included to conduct the output current during intervals when the rectifying diode 10 is back biased.

At the instance of initial application of the DC source voltage, the transistor 28 is nonconducting. However, current flows from input terminal 1 through the resistor 5 to the base of the power switching transistor 28. A varistor 22 connected to the base of transistor 28 is utilized to prevent this drive current from being shunted from the base of transistor 28.

Transistor 28 is biased conducting in response to this drive current produced by the applied DC voltage. With transistor 28 conducting, a DC voltage is applied across the primary winding 6 via a completed power path including input terminal 1, inductor 4, winding 6, transistor 28, lead 29, resistor 19, lead 30, and input terminal 2. Resistor 19 is a low impedance current sensing resistor used in the base drive compensation circuit as described below. In response to this DC voltage applied across winding 6, voltages, in accordance with the winding dot notations shown, are induced in the secondary winding 7 and in the feedback winding 8. The voltage induced across winding 7 forward biases the rectifying diode 10 and current is applied, via the output filter inductor 12, to the output terminal 14 and from thence to a load connected thereto. A filter capacitor 13 shunting the output terminals 14 and 15 is utilized to reduce the ripple voltage output to a minimum.

In response to the voltage applied to the primary winding 6, a regenerative feedback voltage is induced in the feedback winding 8. This induced feedback voltage is applied, via resistor 21, and the varistor 22 to the base of transistor 28 to regeneratively drive it further into its conduction state and finally into saturation. This regenerative feedback voltage also charges capacitors 23 and 26 to a positive voltage. The voltage on the capacitor 26 increases in magnitude in response to the regenerative charging. This positive voltage is applied to the base of transistor 27 and upon attaining a predetermined voltage threshold biases it into conduction. With the transistor 27 biased into conduction, the base current applied to transistor 28 is diverted from the base of transistor 28 through the collector-emitter path of transistor 27 to ground or reference voltage level at input terminal 2. The switching transistor 28 is biased nonconducting and the DC voltage is removed from the primary winding 6. In response to this removal of voltage, a reverse voltage is induced in the transformer windings 7 and 8.

The reverse voltage induced across the secondary winding 7 reverse biases the rectifying diode 10. The load current is now conducted through the flyback diode 11 in response to the induced voltage in the inductor 12 and is applied, via terminal 14, to the load. The reverse voltage generated in the winding 8 charges the capacitors 23 and 26 in a negative polarity direction as compared to the positive polarity charging induced in response to the current conducted by transistor 28. The positive voltage originally stored on capacitor 23 during the conduction of transistor 28 is discharged through the collector-base path of transistor 27.

The core of the transformer 9 resets and the voltages across the windings 6, 7, and 8 decay to zero. The charge stored on the capacitor 23 plus the current from the input through resistor 5 causes the switching transistor 28 to again turn on. The operating cycle of the converter is again repeated in the same fashion as described above.

The converter circuit includes base drive compensating circuitry to stabilize the current gain of the saturated switching transistor 28 irrespective of changes in the load current magnitude and changes in the input voltage applied to input terminals 1 and 2. The base drive compensating circuit advantageously prevents accumulation of excessive stored charge in the switching transistor 28 which can cause large storage time therein due to wide collector current surges or swings. As described hereinabove, the base drive current is derived from the regenerative feedback winding 8 and is applied to the base electrode of transistor 28 via the resistor 21 and the varistor 22. A two-branch sink circuit 40 is connected to this feedback base drive to controllably divert base drive current in order to maintain the forced current gain of the saturated power transistor. A reference current branch including diode 17 establishes a reference signal to bias transistor 31. The transistor 31 has its collector-emitter path included in a current drain branch connected to the base of the power transistor 28.

In normal operations the regenerative voltage across feedback winding 8 provides drive current via resistor 16 to the transistor 31 in the current drain branch. This biases transistor 31 conducting. With the transistor 31 conducting, a controlled portion of the base drive current is diverted from the base of the power transistor 28 through the collector-emitter path of transistor 31 during the saturation interval of transistor 28.

If the saturated collector current of power transistor 28 increases, it is apparent that the voltage drop across the resistor 19 increases. The diode 17 and the resistor 18 of the reference current branch coupled to winding 8 are connected across the base emitter of transistor 31 and the series connected resistors 19 and 20. The increased voltage drop across resistor 19 in response to the increased collector current causes the resistor 18 and the diode 17 to divert base drive current from the transistor 31. Hence, the conductivity of transistor 31 is decreased. Since less base drive current is diverted from the base of transistor 28, the base drive current to transistor 28 increased in proportion to its increased collector current and the saturated current gain is stabilized at a constant value.

It is apparent from the above description that should the collector current on transistor 28 decrease, the transistor 31 will respond to conduct more current since the biasing curcuit will increase its conductivity. The current gain of the saturated power transistor 28 is maintained constant because the transistor 31 is constrained to conduct inversely with the collector current oupput of transistor 28.

It will be readily apparent to those skilled in the art that the base drive compensation circuit described above advantageously limits changes in base drive which may occur due to changes in the applied base drive source voltage. This advantage is attained because the current in the current drain branch tracks the current through the reference current branch.

What is claimed is:

1. In combination,
   a power transistor operating in a saturated mode,
   means for supplying a base drive current to said power transistor,
   means for diverting base drive current from a base of said power transistor, comprising
   a current drain transistor connected to the base of said power transistor,
   means for establishing a control bias coupled to a control electrode of said current drain transistor, and
   means for sensing the current magnitude of current in a main conduction path of said power transistor, said means for sensing operative to generate a signal proportional to said current magnitude and connected to an output electrode of said current drain transistor, said means for sensing further coupled to said means for establishing a control bias in order to control a magnitude of a control bias established therein, whereby a magnitude of current diverted from said base of said power transistor is controlled by said signal proportional to said current magnitude.

2. The combination defined in claim 1 wherein said means for sensing comprises a resistor and said means for establishing a control bias comprises a semiconductor junction coupled to an emitter base junction of said current drain transistor.

3. Base drive compensating circuitry to maintain base current in a saturated transistor proportional to collector current comprising:
   a resistor biased current sink including;
   a first current branch to establish a reference current including a semiconductor diode and a first impedance connected in series therewith;
   a second current branch to divert base current from said saturated transistor including
   a second transistor having a base electrode connected to said semiconductor diode and a collector-to-emitter main conduction path coupled to divert base current from said saturated transistor, and
   a current sensing impedance coupled to sense saturated current in said first transistor and connected in series with said main conduction path of said second transistor, whereby a voltage drop ratio of voltage across said first impedance and across said current sensing impedance controls a magnitude of base current diverted from said saturated transistor.

4. A base drive compensation circuit to regulate the current gain of a saturated power transistor comprising:
   current sensing means coupled to monitor a magnitude of a collector emitter current of said saturated power transistor;
   bias means to supply base drive current coupled to a base of said saturated power transistor;
   current sink means to divert current from the base of said saturated power transistor comprising a current drain transistor including a collector emitter path connected to the base of said saturated power transistor, said current sensing means including a resistor connected to the collector-emitter path of said current drain transistor, a current control diode connected to bias an emitter base junction of said current drain transistor and connected to be responsive to current flow in said current sensing means, whereby said current sink means is responsive to said current sensing means to control a magnitude of current diverted from the base of said saturated power transistor in inverse proportion to the magnitude of the collector-emitter current of said saturated power transistor in order to regulate the current gain therein.

* * * * *